(12) United States Patent
Norberg et al.

(10) Patent No.: US 10,998,252 B2
(45) Date of Patent: *May 4, 2021

(54) EFFICIENT HEAT-SINKING IN PIN DIODE

(71) Applicant: Juniper Networks, Inc., Sunnyvale, CA (US)

(72) Inventors: Erik Johan Norberg, Santa Barbara, CA (US); Naser Dalvand, Mountain View, CA (US); Gregory Alan Fish, Santa Barbara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/791,315

(22) Filed: Feb. 14, 2020

(65) Prior Publication Data

US 2020/0211923 A1    Jul. 2, 2020

Related U.S. Application Data

(63) Continuation of application No. 16/237,300, filed on Dec. 31, 2018, now Pat. No. 10,651,110.

(51) Int. Cl.
*H01L 23/42* (2006.01)
*H01L 29/868* (2006.01)
(Continued)

(52) U.S. Cl.
CPC ........ *H01L 23/42* (2013.01); *H01L 21/76802* (2013.01); *H01L 21/76877* (2013.01);
(Continued)

(58) Field of Classification Search
CPC ..... H01L 23/42; H01L 23/36; H01L 27/1203; H01L 29/6609; H01L 29/868; H01L 21/76877; H01L 21/76802
(Continued)

(56) References Cited

U.S. PATENT DOCUMENTS 7,608,867 B2 * 10/2009 Charbuillet ........... H01L 29/868
257/104
7,639,719 B2   12/2009 Fang et al.
(Continued)

FOREIGN PATENT DOCUMENTS

CN       103930990       7/2014
CN       207719244       8/2018

OTHER PUBLICATIONS

US 10,615,099 B1, 04/2020, Norberg et al. (withdrawn)
(Continued)

*Primary Examiner* — Dao H Nguyen
(74) *Attorney, Agent, or Firm* — Schwegman Lundberg & Woessner, P.A.

(57) ABSTRACT

The thermal impedance of p-i-n diodes integrated on semiconductor-on-insulator substrates can be reduced with thermally conducting vias that shunt heat across thermal barriers such as, e.g., the thick top oxide cladding often encapsulating the p-i-n diode. In various embodiments, one or more thermally conducting vias extend from a top surface of the intrinsic diode layer to a metal structure connected to the doped top layer of the diode, and/or from that metal structure down to at least the semiconductor device layer of the substrate.

20 Claims, 12 Drawing Sheets

(51) Int. Cl.
*H01L 27/12* (2006.01)
*H01L 21/768* (2006.01)
*H01L 29/66* (2006.01)
*H01L 23/36* (2006.01)

(52) U.S. Cl.
CPC .......... *H01L 23/36* (2013.01); *H01L 27/1203* (2013.01); *H01L 29/6609* (2013.01); *H01L 29/868* (2013.01)

(58) Field of Classification Search
USPC ......... 257/656, 288, 369, 133, 200, 302, 79, 257/754, E23.105, E21.585, E21.446, 257/E27.039, E27.073, E27.12, E29.109, 257/E29.022, E33.023; 385/14, 37; 438/196, 200, 64
See application file for complete search history.

(56) References Cited

U.S. PATENT DOCUMENTS

| | | | | |
|---|---|---|---|---|
| 8,482,078 | B2* | 7/2013 | Cheng | H01L 21/823418 257/369 |
| 9,048,108 | B2* | 6/2015 | Cheng | H01L 27/0629 |
| 9,372,307 | B1 | 6/2016 | Budd et al. | |
| 2007/0105265 | A1* | 5/2007 | Lai | H01L 31/0203 438/64 |
| 2009/0078963 | A1* | 3/2009 | Khodja | H01S 5/0261 257/189 |
| 2009/0207568 | A1 | 8/2009 | Haveri | |
| 2010/0000766 | A1 | 1/2010 | Loiselet et al. | |
| 2012/0001305 | A1* | 1/2012 | Peroni | H01L 29/417 257/656 |
| 2016/0087160 | A1 | 3/2016 | Cheng et al. | |

OTHER PUBLICATIONS

"U.S. Appl. No. 16/237,300, Notice of Allowance dated Dec. 30, 2019", 9 pgs.
"European Application Serial No. 19181601.6, Extended European Search Report dated Jan. 17, 2020", 6 pgs.
"U.S. Appl. No. 16/237,300, Corrected Notice of Allowability dated Apr. 9, 2020", 2 pgs.
"Chinese Application Serial No. 201910567986.3, Office Action dated Dec. 18, 2020", w Concise Statement of Relevance, 9 pgs.
"European Application Serial No. 19181601.6, Response filed Jan. 4, 2021 to Extended European Search Report dated Jan. 17, 2020", 25 pgs.

* cited by examiner

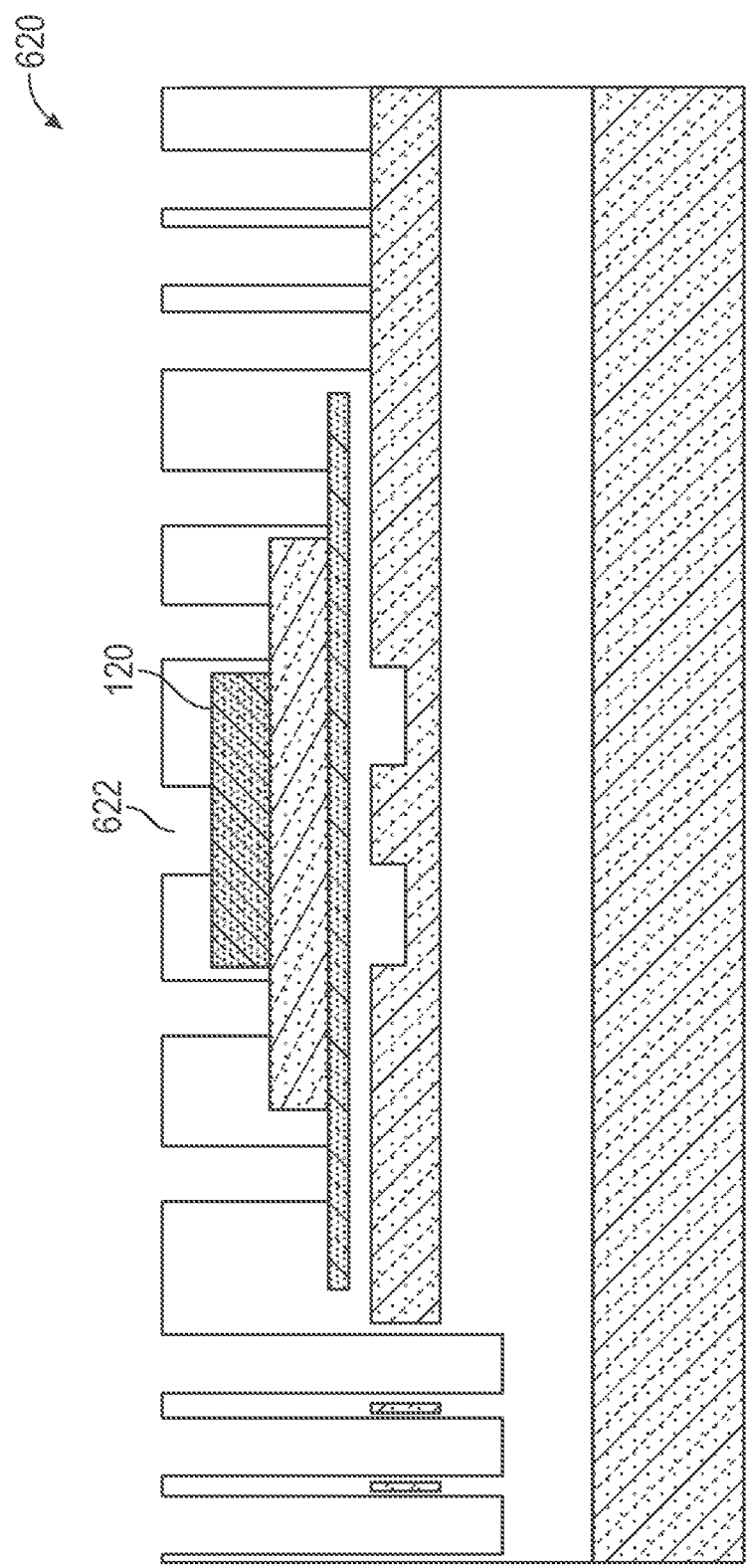

US 10,998,252 B2

EFFICIENT HEAT-SINKING IN PIN DIODE

PRIORITY

This application is a continuation of U.S. patent application Ser. No. 16/237,300, filed Dec. 31, 2018, which is incorporated by reference herein in its entirety.

TECHNICAL FIELD

This disclosure relates generally to p-i-n (PIN) diodes implemented in photonic integrated circuits (PICs), and, in particular, to structures for efficiently dissipating heat generated in the PIN diodes.

BACKGROUND

Chip-integrated laser diodes tend to generate a significant amount of heat in the active gain medium. Since the output power and reliability of the laser diode degrade with increasing temperature of the active gain medium, they are constrained by the ability to heat-sink the structure, i.e., transfer heat away from the active gain medium. Integrated laser diodes are often implemented as stacks of n-type, intrinsic, and p-type compound semiconductor layers, with the intrinsic layer providing the active gain medium, and may be disposed on a semiconductor-on-insulator (SOI) substrate. In various conventional implementations, a thick top oxide encapsulating the p-i-n stack constitutes a substantial thermal barrier that prevents heat from efficiently dissipating laterally away from the intrinsic layer. Heat dissipates, in these structures, primarily from the intrinsic layer through the diode layer below to the substrate as well as through the diode layer above to a top-side metal layer in contact with the top diode layer, from where the heat can sink through bumps or electrical contacts and/or back down through the thick top oxide to the substrate. Heat transfer through these paths is limited, rendering the thermal impedance of the laser diode insufficient for the laser output power and operational reliability desired in many applications.

BRIEF DESCRIPTION OF THE DRAWINGS

Various example embodiments are herein described in conjunction with the accompanying drawings, in which:

FIGS. 6A-6F further illustrate the method of FIG. 5 with cross-sectional side views of the structures resulting from various steps of the method, in accordance with various embodiments.

DETAILED DESCRIPTION

Disclosed herein are structural improvements to integrated PIN diode devices (such as, e.g., diode lasers) that heat-sink the active gain medium more efficiently, along with associated fabrication methods. In various embodiments, one or more via holes filled with a thermally conducting material (herein also "thermal vias") shunt heat across layers that otherwise constitute significant thermal barriers. For example, heat transfer from the intrinsic layer to a metal structure (e.g., layer) above the PIN diode may be enhanced by thermal vias between the intrinsic layer and the metal structure. Alternatively or additionally, heat transfer from the metal structure to the substrate may be improved by thermal vias from the metal structure through the top oxide to the substrate. Beneficially, in accordance with various embodiments, the creation of these thermal vias can be seamlessly integrated into existing process flows for PIN diodes, with some modifications to the employed mask designs, but without the need for additional processing that would increase the cost and complexity of fabrication.

Figure 1:
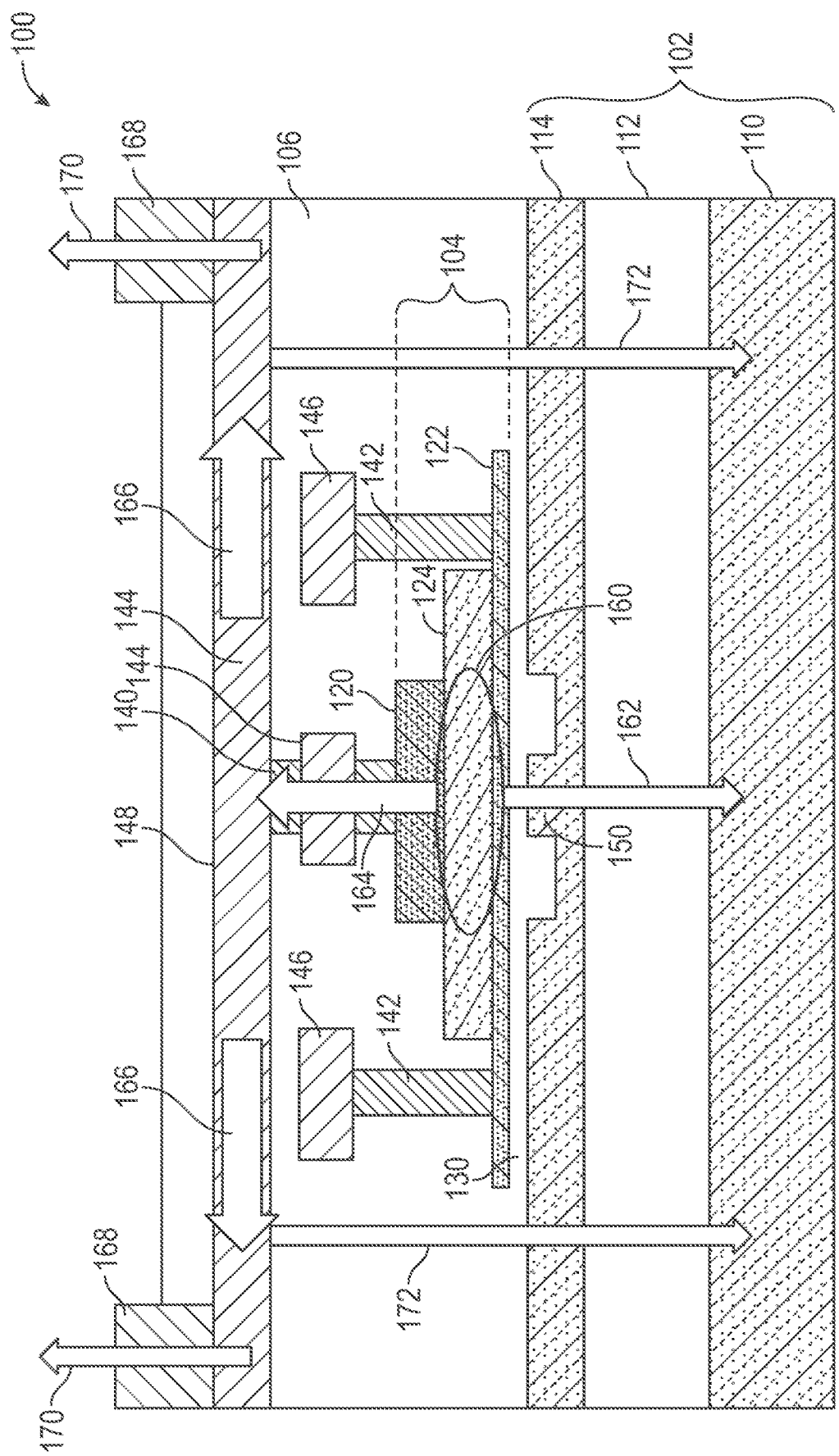
FIG. 1 is a cross-sectional side view of an example integrated PIN diode device in accordance with various embodiments, illustrating heat-dissipation paths away from the active layer of the PIN diode.

In the following, various example embodiments are described with reference to the accompanying drawings. For reference, FIG. 1 illustrates a structure for an integrated PIN diode device that utilizes conventional heat-dissipation paths. FIGS. 2A-4 show enhancements to the structure of FIG. 1 that improve heat-sinking efficiency. The figures capture pertinent structural components schematically, but are not drawn to scale.

With reference to FIG. 1, an example integrated PIN diode device 100 in accordance with various embodiments is depicted in a cross-sectional side view. The device 100 includes an SOI substrate 102 and, disposed thereabove, a PIN diode structure 104 embedded in a thick top oxide (or other dielectric) cladding (herein also simply "top oxide") 106.

The substrate 102 generally includes a semiconductor handle 110, a dielectric (e.g., oxide) layer 112 disposed thereabove, and a semiconductor device layer 114 formed on top of the dielectric layer 112. In standard silicon-on-insulator substrates, the handle 110 and device layer 114 are both made of silicon, whereas the dielectric layer 112 is made of silicon dioxide (and is often referred to as the "buried oxide" or "BOX" layer). However, other material combinations may also be used for the SOI substrate 102. For example, aluminum oxide or diamond may be used in lieu of silicon dioxide for the dielectric layer 112, and the handle 110 may be made of aluminum oxide or diamond instead of silicon. The top oxide cladding 106 may likewise be silicon dioxide, or some other dielectric material, such as, e.g., aluminum oxide or silicon nitride.

The diode structure 104 includes doped top and bottom layers 120, 122 and, "sandwiched" therebetween, an intrinsic layer 124. Usually, the top layer 120 is a p-type layer and the bottom layer is an n-type layer, but the reverse arrangement (with an n-type top layer and a p-type bottom layer) is also possible. For definiteness, the following description presumes the top layer to be the p-type layer. The diode layers 120, 122, 124 may be made of compound semiconductor materials, such as, e.g., III-V materials (i.e., compound semiconductors made from a combination of group-III and group-V elements) or II-VI materials (i.e., compound semiconductors made from a combination of group-II and group-VI elements). Example materials frequently used for integrated PIN diodes include, without limitation, gallium arsenide (GaAs), gallium indium aluminum arsenide (GaInAlAs), gallium nitride (GaN) and indium phosphide (InP). The intrinsic layer 124 may be a bulk semiconductor layer, or may, alternatively, be, or include a region, composed of quantum wells, quantum dots, or quantum dashes. The intrinsic layer 124 generally includes an active region made of undoped ("intrinsically semiconducting") material (e.g., the quantum well/dot/dash region), but may also include one or more sub-layers of n-doped and/or p-doped materials (e.g., along the top and/or bottom side of the layer 124); that is, the diode layer 124 herein denoted as the "intrinsic layer" need not be made of intrinsic material in its entirety. As shown, the layers of the diode structure may decrease in width from the bottom layer 122 to the top layer 120. In some embodiments, the top and intrinsic layers 120, 124 form a ridge significantly narrower than the bottom layer 122. Further, the top layer 120 may be significantly thicker than the bottom layer 122 and/or (unlike depicted) than the intrinsic layer 124. As further shown, the diode structure 104 may be separated from the substrate 102 by a thin dielectric layer 130, which may form an integral part of the top oxide 106. This dielectric layer 130 may serve as electrical insulation between the diode structure 104 and the semiconductor device layer 114 (as is needed in some, but not all embodiments disclosed herein below) as well as to improve mechanical bonding between the diode structure 104 and the underlying device layer 114 to facilitate heterogeneous (e.g., Si/III-V) integration.

The device 100 further includes electrical vias 140, 142 that provide electrical connections to the p-type (top) layer 120 and n-type (bottom) layer 122, respectively. These vias 140, 142 are connected to respective p-side (top-side) and n-side (bottom-side) metal structures 144, 146 (herein also referred to as the "p-side metal" 144 and the "n-side metal" 146), which are in turn connected to different respective electrical nodes. As shown, the p-side and n-side metals 144, 146 may form layers embedded at multiple levels within the top oxide 106 (e.g., including an upper metal contact layer 148 that is part of the p-side metal structure 144). Both the vias 140, 142 and the associated p-side and n-side metals 144, 146 may be made, for example and without limitation, of gold or aluminum. When a voltage is applied between the p-type and n-type layers 120, 122 through the respective vias 140, 142, light is generated in the active intrinsic layer 124. The light may be coupled from the intrinsic layer 124 through the n-type layer 122 and the (in some embodiments optional) dielectric layer 130 into a waveguide 150 formed in the semiconductor device layer 114. (Alternatively to operating as a laser diode, the device 100 can function as a photodetector that measures, in terms of a photocurrent generated between the p-type and n-type layers 120, 122, the intensity of light coupled from the waveguide 150 into the intrinsic layer 124. While the below-described modifications to the device 100 are discussed and most beneficial in the context of a laser diode, they can also be applied and provide benefits if the device 100 is used as a photodetector.)

In the intrinsic layer 124, heat is primarily generated in the region 160 underneath the often ridge-like p-type layer 120. The heat can dissipate along various paths indicated in FIG. 1 by respective arrows. A first path 162 goes from the intrinsic layer 124 through the bottom layer 122 of the diode, the thin dielectric layer 130 (if any), and the semiconductor device layer 114 and buried oxide (or other dielectric) layer 112 of the substrate 102 into the substrate handle 110. This heat transfer is relatively poor because the associated area through which heat flows is defined by the area of heat generation, which is essentially the small area underneath the p-type layer 120, as lateral heat spreading in the intrinsic and n-type layers 124, 122 is generally poor due to their small thickness and low thermal conductivity. Along a second path, heat is transferred upward from the intrinsic layer 124 through the p-type layer 120 and the associated electrical via 140 to a metal contact layer 148 of the associated p-side metal 144 (partial heat path 164), where the heat can spread laterally (partial heat path 166) and then sink through electrical contact points 168, such as, without limitation, metal pillars, solder bumps, or wire-bonds (partial heat path 170). This path is likewise limited in its heat-sinking efficiency because the path length in the metal contact layer from the p-type layer 120 to the electrical contact point 168 is usually large and the ability of the electrical contact points 168 to dissipate heat may itself be limited. A third path goes likewise upward to, and spreads laterally in, the metal contact layer 148 (partial heat paths 164, 166), but the heat is then transferred back down through the top oxide 106 and the semiconductor device and buried oxide layers 114, 112 to the substrate handle 110 (partial heat path 172). Heat transfer along this path is also relatively poor due to the thick top oxide 106 between the metal contact layer of the p-side metal 144 and the substrate 102, and to a lesser extent due to the buried oxide layer 112.

Figure 2A:
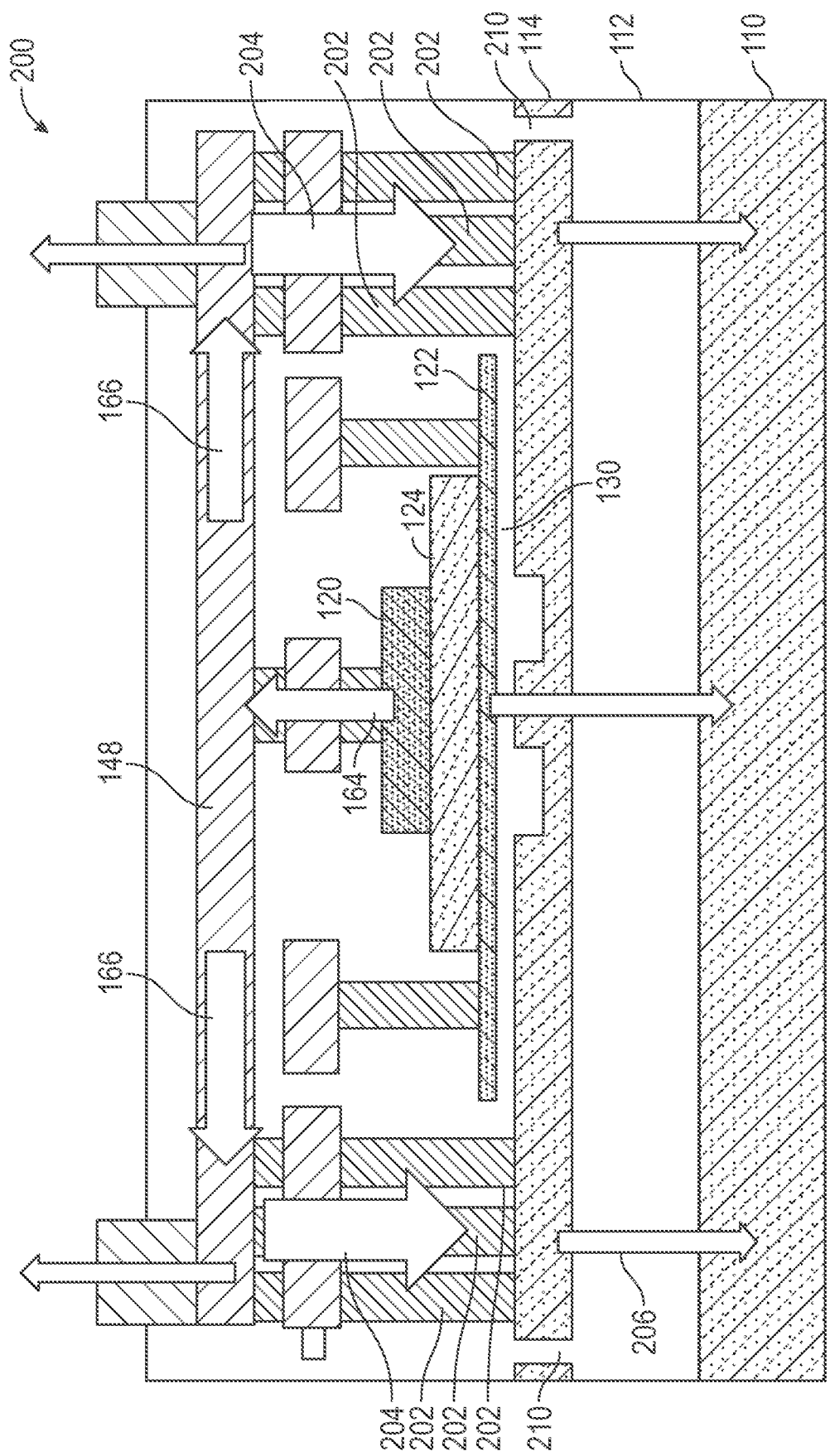
FIGS. 2A and 2B are cross-sectional side views of example integrated PIN diode devices in which heat dissipation is enhanced by thermal vias shunting heat from a metal structure connected to the top diode layer to the substrate, in accordance with various embodiments.

FIG. 2A illustrates, in a cross-sectional side view, an example integrated PIN diode device 200 in which heat dissipation along the third above-described path, i.e., upward through the electrical via 140 contacting the p-type layer 120, laterally through the metal contact layer 148 of the p-side metal 144, and back down through the top oxide 106 into the substrate 102 (partial heat paths 164, 166, 172), is enhanced by one or more thermal vias 202 shunting heat from the metal contact layer 148 to the semiconductor device layer 114 of the substrate 102 (partial heat path 204, which forms a portion of partial heat path 172), in accordance with various embodiments. These thermal vias 202, which are placed to one or both sides of the diode structure 104, effectively remove the thermal barrier otherwise presented by the thick top oxide 106, and thereby allow for more efficient heat-sinking of the diode structure 104. Importantly, to avoid electrically shorting the p-type and n-type diode layers 120, 122 in the device 200 of FIG. 2A, the n-type layer 120 is, in this embodiment, electrically insulated from the semiconductor device layer 114 (e.g., by the intervening dielectric layer 130).

Note that the third heat path through the enhanced device 200, like the first above-described path 162 down through the n-type layer 122 and dielectric layer 130 and partially through the substrate 102 into the handle 110, still includes heat transfer through the buried oxide layer 112 (partial heat path 206, which forms another portion of partial heat path 172) to ultimately sink heat in the substrate handle 110. However, the number and/or width of the one or more thermal vias 202 can be configured such that their total cross-sectional area (in a plane parallel to the plane of the substrate 102), which defines the area of heat transfer along this path, exceeds the area of heat generation in the diode structure 104 (i.e., the area underneath the p-type layer 120). As a result of such a larger heat-transfer area, heat dissipation along the enhanced third path (164, 166, 204, 206) in the device 200 can also provide an improvement over the first above-described path 162 downward into the substrate handle 110.

In some embodiments, the PIN diode device 200 includes isolation trenches 210 formed in the semiconductor device layer 114 surrounding the diode structure 104 and thermal vias 202 to electrically isolate the device 200 from other components integrated on the same platform. Without such isolation, the electrical connection between the p-type diode layer 120 and the semiconductor device layer 114 may be detrimental to the laser diode or other components within the PIC. For example, where multiple laser diodes are integrated on the same platform with a continuous, electrically conducting semiconductor device layer in between, electrically connecting the p-sides of the diodes to the semiconductor device layer 114 could cause leakage currents between the diodes, as their p-sides may be held at different electrical potentials. Also, high-speed components, such as photodiodes or modulators, integrated on the same platform may suffer signal-integrity degradation as a result of noise coupled into them from the diode device 200 through the shared semiconductor device layer 114. These and similar issues can be avoided with isolation trenches 210 electrically separating the different components.

Figure 2B:
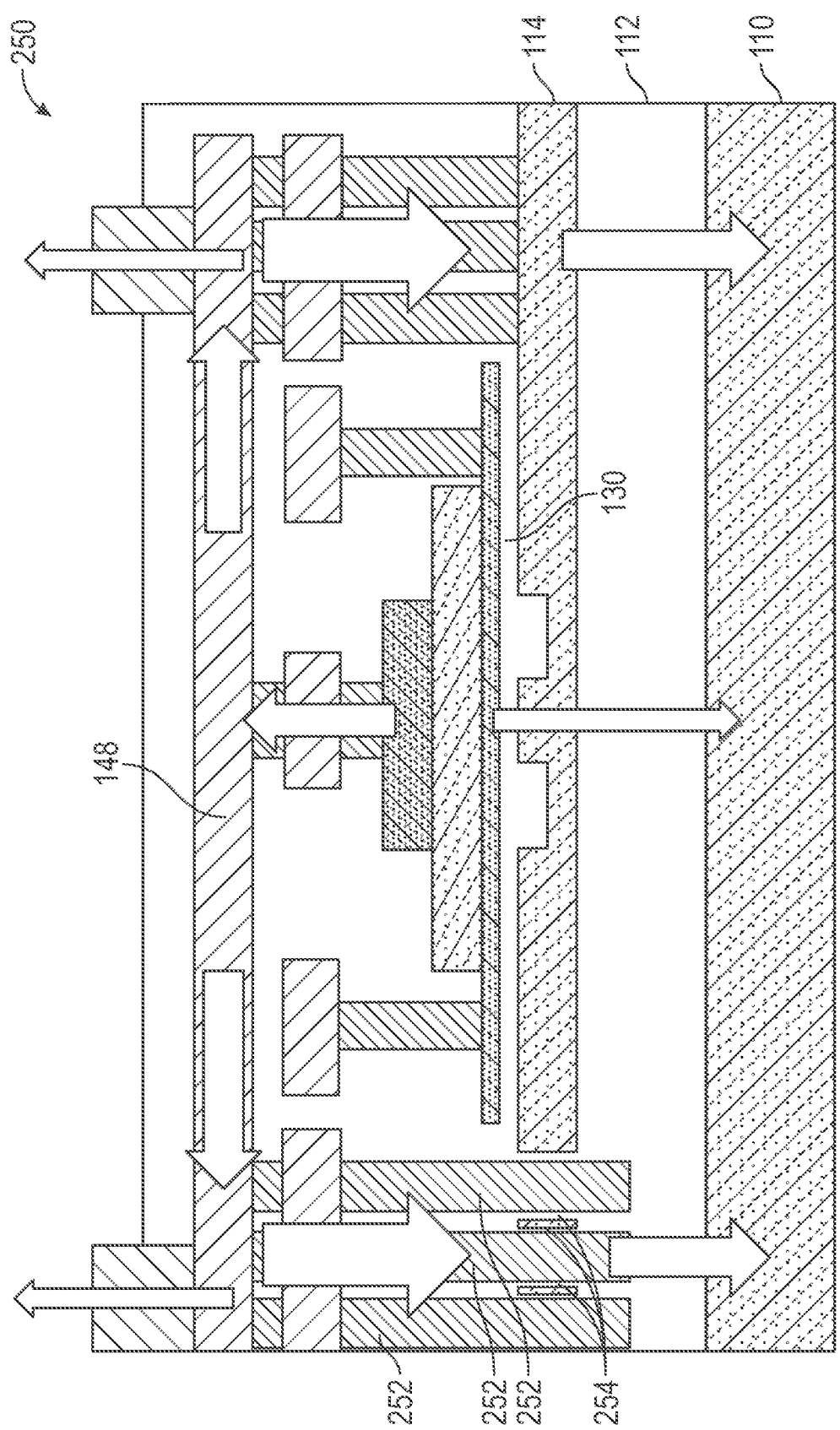

FIG. 2B illustrates, in a cross-sectional side view, an example integrated PIN diode device 250 in which heat dissipation between the metal contact layer 148 and the substrate handle 110 along the third above-described path is further enhanced by one or more thermal vias 252 extending from the metal contact layer 148 not only to the semiconductor device layer 114, but through openings 254 in the semiconductor device layer 114 partially through the buried oxide layer 112, in accordance with various embodiments. By shunting heat, in this manner, through a portion of the buried oxide layer 112, the thermal impedance of the buried oxide layer 112 is effectively reduced. Note that extending thermal vias all the way through the buried oxide layer 112 to the handle 110 is not feasible without adding complexity to the overall fabrication process flow, while partially etching into the buried oxide layer 112 to create thermal vias 252 as depicted in FIG. 2B is possible without significantly altering the process flow, and thus provides a good trade-off between heat-sinking efficiency and fabrication cost and complexity.

In the embodiment of FIG. 2B, prior to forming the thermal vias 252, the openings 254 in the semiconductor device layer 114 may be filled with a dielectric material (e.g., the top oxide 106, which will inherently fill the openings 254 as it is deposited over the diode structure 104). This dielectric filling electrically insulates the thermal vias 252 from the semiconductor device layer 114, and may obviate the need for a dielectric layer 130 in between the device layer 114 and the diode structure 104 formed thereabove as well as the need for isolation trenches 210.

Figure 3:
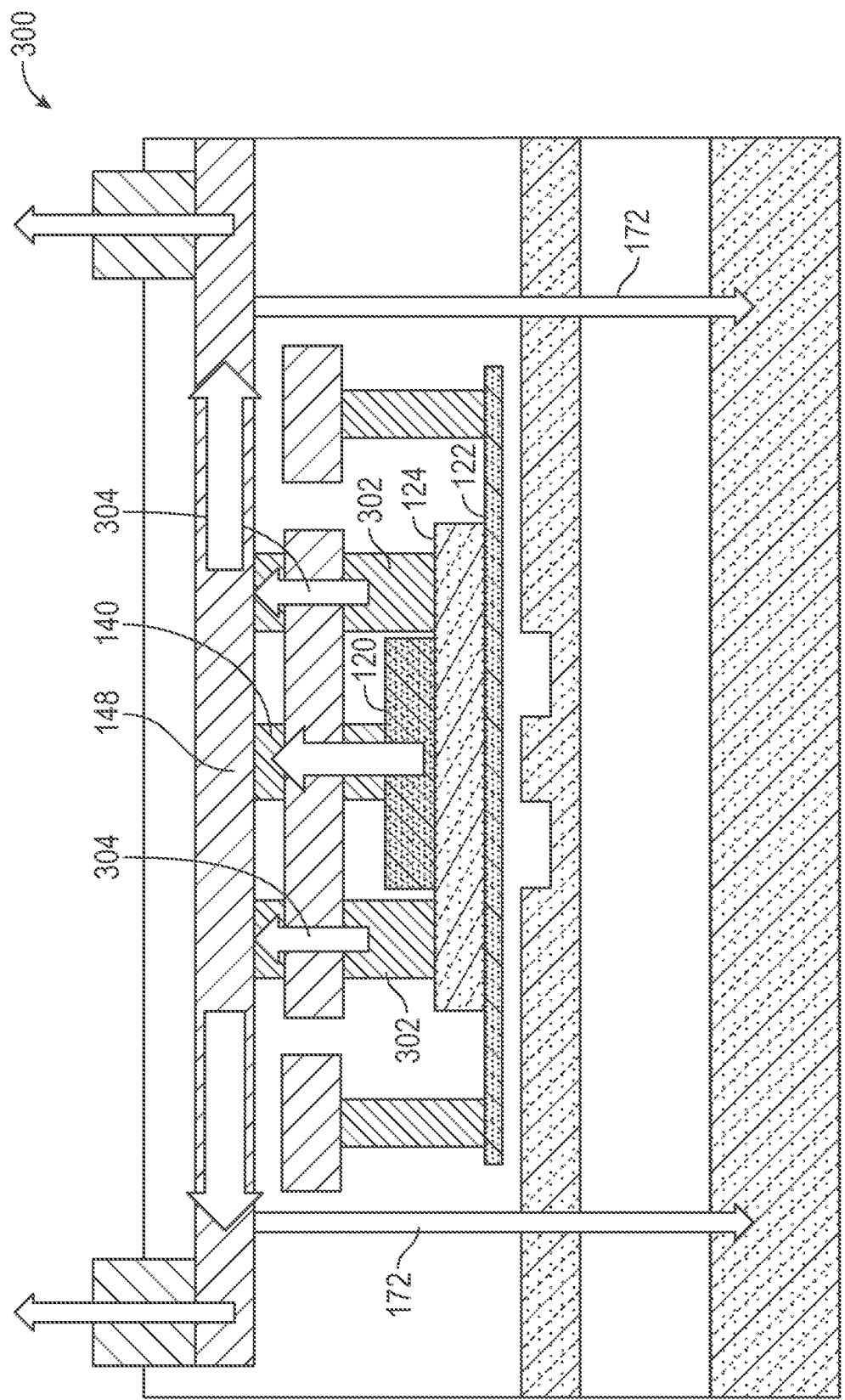
FIG. 3 is a cross-sectional side view of an example integrated PIN diode device in which heat dissipation is enhanced by thermal vias shunting heat from a top surface of the intrinsic diode layer to a metal structure connected to the top diode layer, in accordance with various embodiments.

FIG. 3 depicts an example integrated PIN diode device 300 in which heat dissipation is enhanced by thermal vias 302 transferring heat from the top surface of the intrinsic diode layer 124 to the metal contact layer 148 of the p-side metal structure 144, in accordance with various embodiments. The added thermal vias 302 supplement the heat flow from the intrinsic layer 124 upward through the p-type layer 122 and its associated electrical via 140 (partial heat path 164) with a parallel partial heat path 304, thereby increasing the overall efficiency of heat transfer from the intrinsic layer 124 to the metal contact layer 148, and thus the heat-sinking efficiency of the second and third heat paths described with respect to FIG. 1. The thermal vias 302 may be placed on top of the intrinsic layer 124 to one or both sides of the p-type layer 120. In some embodiments, the thermally conductive material used for the thermal vias 302 also absorbs light; in this case, the thermal vias 302 are placed as close to the p-type layer 120 (and, thus, the center of heat generation underneath the p-type layer 120) as possible without risking interaction with the optical mode in the intrinsic layer 124, as such optical interaction would cause undesirable optical loss. For a given configuration of the diode structure 104, the optimal distance between the edges of the p-type layer 120 and thermal vias 302 that face one another can be determined by optical simulation software (e.g., standard software with suitable adjustments for this purpose, which can be straightforwardly implemented by those of ordinary skill in the and do not require undue experimentation).

Figure 4:
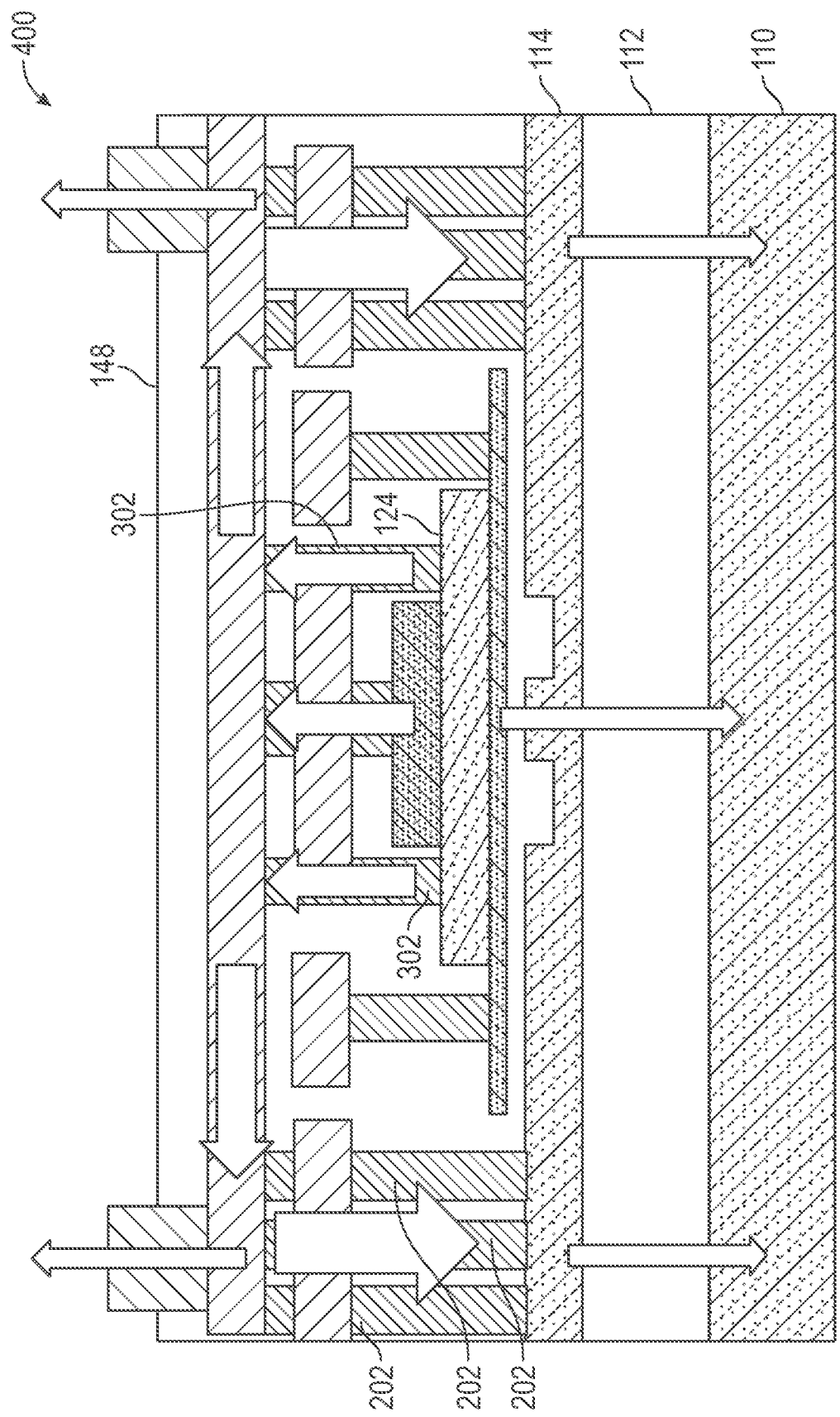
FIG. 4 is a cross-sectional side view of an example integrated PIN diode device using the thermal vias of FIGS. 2A and 3 in combination for improved heat dissipation, in accordance with various embodiments.

FIG. 4 is a cross-sectional side view of an example integrated PIN diode device 400 that combines the thermal vias 202, 302 of the devices 200, 300 depicted in FIGS. 2A and 3 for improved heat dissipation, in accordance with various embodiments. The device 400 provides enhanced heat transfer both from the intrinsic layer 124 up to the metal contact layer 148 of the p-side metal 144, and from the metal contact layer 148 back down to the substrate 102. As will be appreciated, the thermal vias 302 can, alternatively, be combined with the vias 252 extending through the semiconductor device layer 114 partially into the buried oxide layer 112, as shown in FIG. 2B.

The thermal vias included in the PIN diode devices 200, 250, 300, 400 can improve the thermal performance of these devices. For example, in comparative computational simulations of the temperature distributions of, on the one hand, an example device 400 including thermal vias both from the intrinsic layer 124 to the p-side metal 144 and from the p-side metal 144 to the semiconductor device layer 114, and, on the other hand, an example device 100 lacking such thermal vias, the addition of the thermal vias was shown to achieve a 25% reduction in thermal impedance (corresponding to a 25% improvement in thermal heat-sinking).

Turning now to FIGS. 5 and 6A-6F, a method 500, in accordance with various embodiments, for creating efficiently heat-sinked PIN diode devices 200, 250, 300, 400 is illustrated in conjunction with the (intermediate) structures resulting from various steps of the method 500. Beneficially, the method 500 involves only minor and straightforward adjustments to existing process flows, allowing improved heat-sinking to be achieved without added fabrication cost and complexity.

Figure 6A:
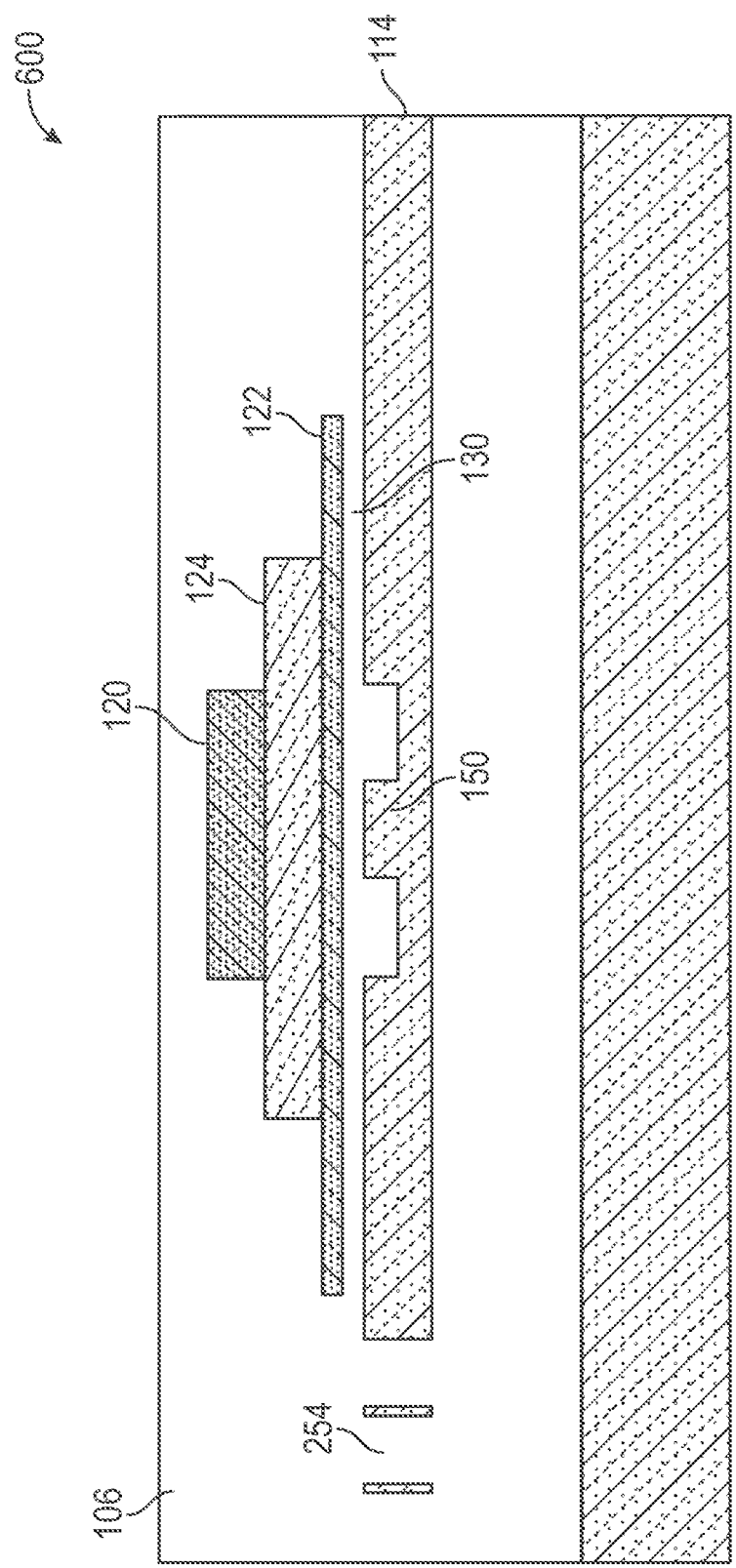

The method 500 involves patterning an SOI substrate 102 (in act 502) to form structural features such as, e.g., a waveguide 150 and, in some embodiments, trenches 210 (as shown for device 200 in FIG. 2A) or openings 254 (as shown for device 250 in FIG. 2B) in the semiconductor device layer 114. The patterning may be achieved by standard photolithography and etching, and may include a sequence of multiple steps to achieve various etch depths (e.g., a partial etch of the semiconductor device layer 114 for the waveguide 150 and full etches for the trenches 210 and/or openings 254). In some embodiments, a thin dielectric layer 130 is deposited over the patterned SOI substrate 102 (optional act 504). Next, a diode structure 104 is created on top of the substrate 102 or dielectric layer 130 by bonding a stack of n-type, intrinsic, and p-type layers and then patterning (e.g., via photolithography and etching) the stack to define the desired width and length of the various layers 122, 124, 120 (act 506). The diode structure 104 is then encapsulated in a thick top oxide cladding 106 deposited over the substrate (act 508). The resulting intermediate device structure 600 is shown in FIG. 6A.

In the next few steps of the process, electrical and thermal vias 140, 142, 202/252, and/or 302 are created, which generally involves patterning the top oxide 106 and etching via holes at the desired location and to the desired depth and/or stop layer (acts 510, 512), and then filling the via holes with the desired material (e.g., a metal) (act 514). In general, vias of the same material that do not differ significantly in length can be created simultaneously, whereas via holes that have substantially different lengths or are to be filled with different materials may involve multiple separate etch and fill steps. In various embodiments of the disclosed PIN diode devices, the overall height of the bottom and intrinsic diode layers 122, 124 and (if present) the dielectric layer 130 underneath is small compared with the length of the electrical and thermal vias 142, 202, 302 contacting these layers, allowing those vias to be created simultaneously.

Figure 5:
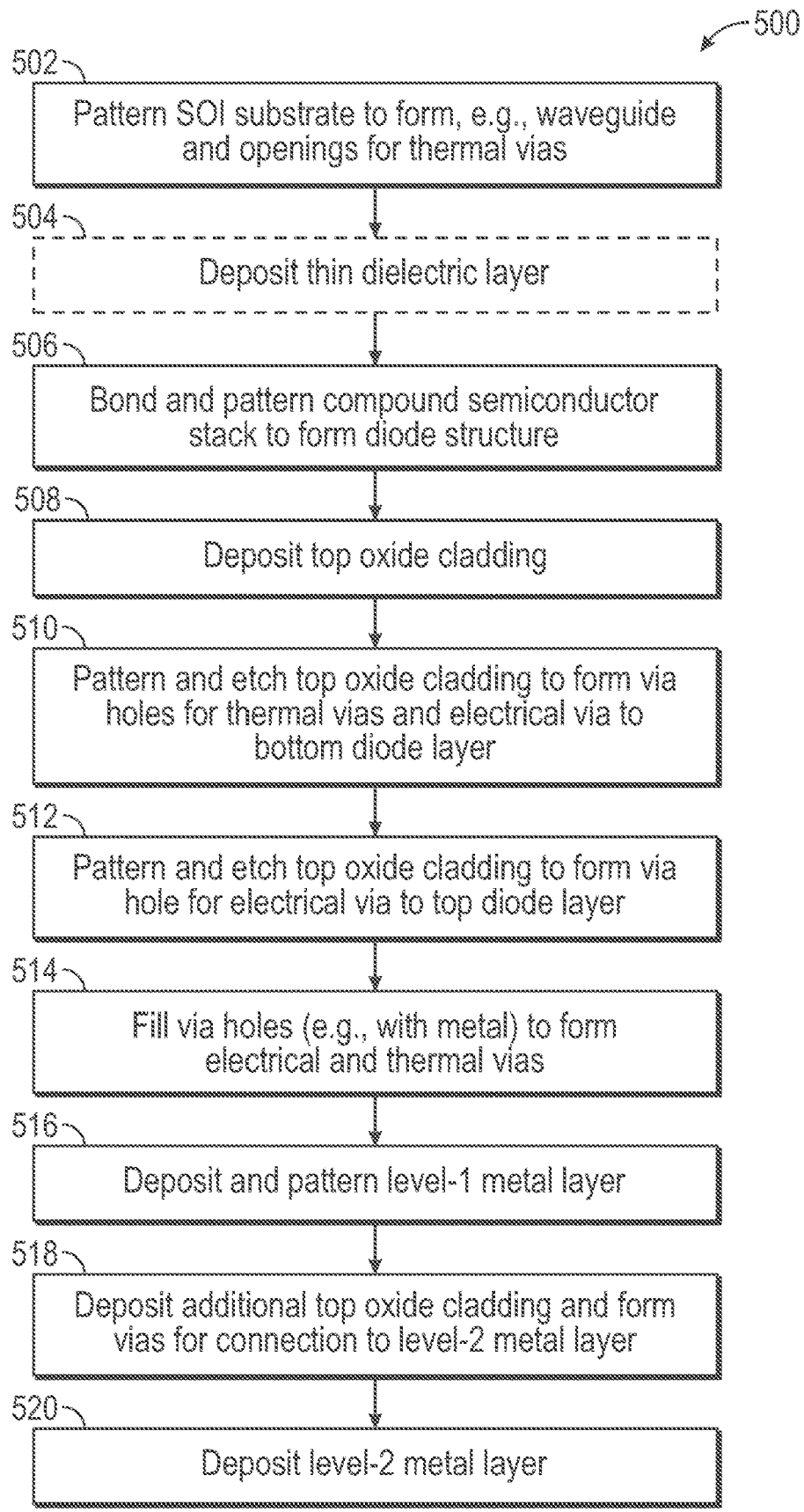
FIG. 5 is a flow chart of a method of creating efficiently heat-sinked PIN diodes, in accordance with various embodiments.
Figure 6B:
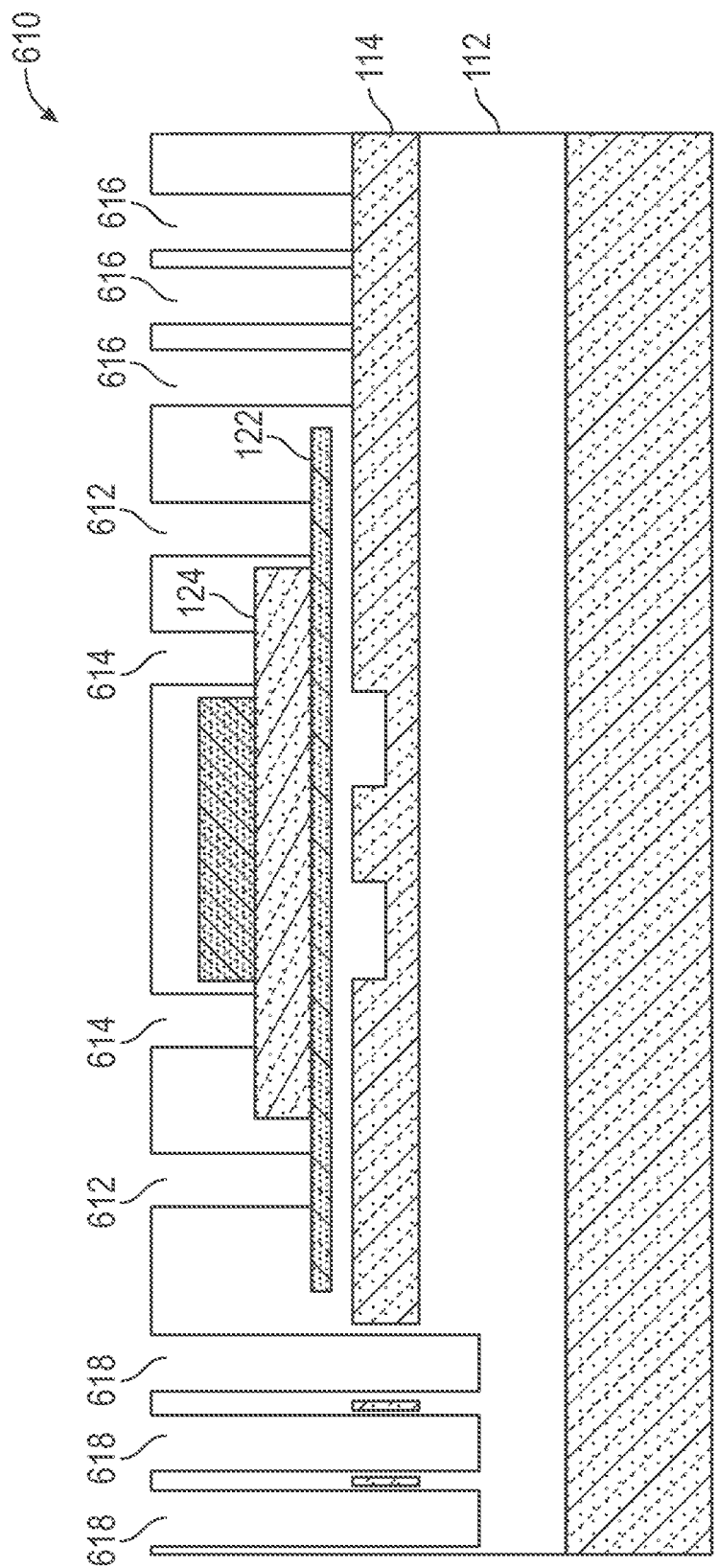

Thus, with renewed reference to FIG. 5 and further with reference to FIG. 6B, the top oxide cladding 106 may be patterned and etched to form, in the same act 510, intermediate device structure 610 (FIG. 6B) with via holes 612 for the electrical n-vias contacting the n-type bottom diode layer 122 and via holes 614, 616 for the thermal vias extending down to the top surface of the intrinsic layer 124 and the top surface of the semiconductor device layer 114, respectively (act 510). In embodiments with thermal vias 252 extending through the semiconductor device layer 114 into the dielectric layer 112 underneath, the respective via holes 618 may, similarly, be formed along with the via holes 612 for the electrical n-vias. (Note that, while FIGS. 6B-6F depict thermal via holes 616 and vias 202 ending at the device layer 114 and thermal via holes 618 and vias 252 penetrating the device layer 114 in the same structure, a given device will usually include only one of these two types of vias 202, 252.) The slightly different lengths of the via holes 612, 614 or 612, 618 can be achieved with the same etch by taking advantage of the diode layers 122, 124 functioning as stop layers for the etch. For example, during a simultaneous etch of thermal via hole(s) 614 and electrical n-via holes 612, the etch of the thermal via hole(s) 614 will stop at the intrinsic layer 124 (due to a much higher etch rate of the top oxide 106 as compared to the semiconductor material of the intrinsic layer) even as the etch of the electrical n-via holes 612 proceeds. Similarly, during a simultaneous etch of thermal via holes 616 or 618 and electrical n-via holes 612, the etch of the electrical n-via holes 612 will stop at the n-type bottom layer 122 while the thermal via holes 616 or 618 are extended further downward through the oxide cladding 106.

With reference to FIGS. 5 and 6C, following formation of the via holes 612, 614, 616, 618 for the thermal vias and electrical n-vias, the top oxide cladding 106 is etched, usually in a separate act 512, to form an intermediate device structure 620 that also includes a via hole 622 for the electrical p-via contacting the p-type top diode layer 120. It may be possible, in some embodiments, to etch all electrical and thermal via holes together in the same step. However, in practice, the p-via is significantly shallower than the n-via (and thermal vias), and is therefore created separately.

Figure 6D:
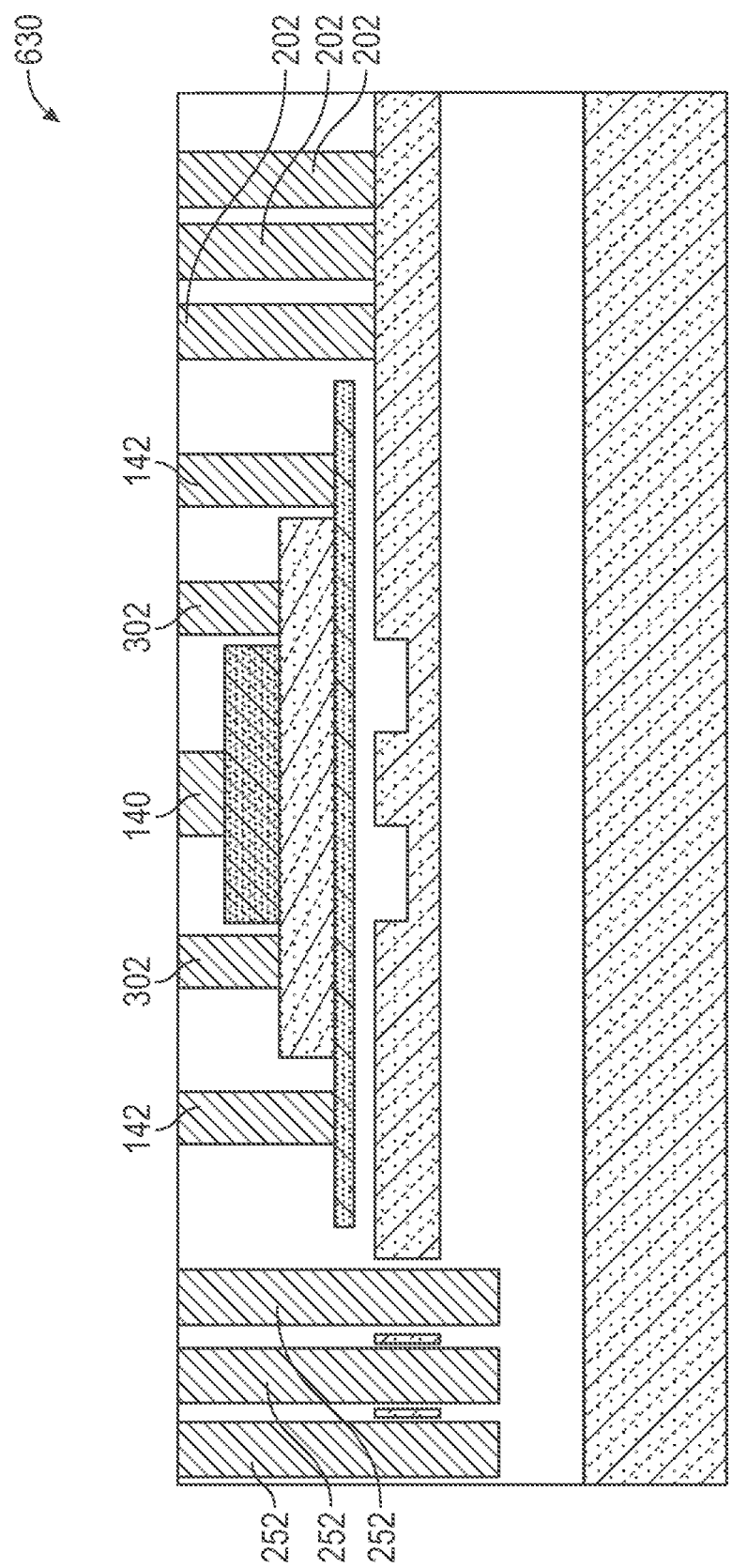
Figure 6E:
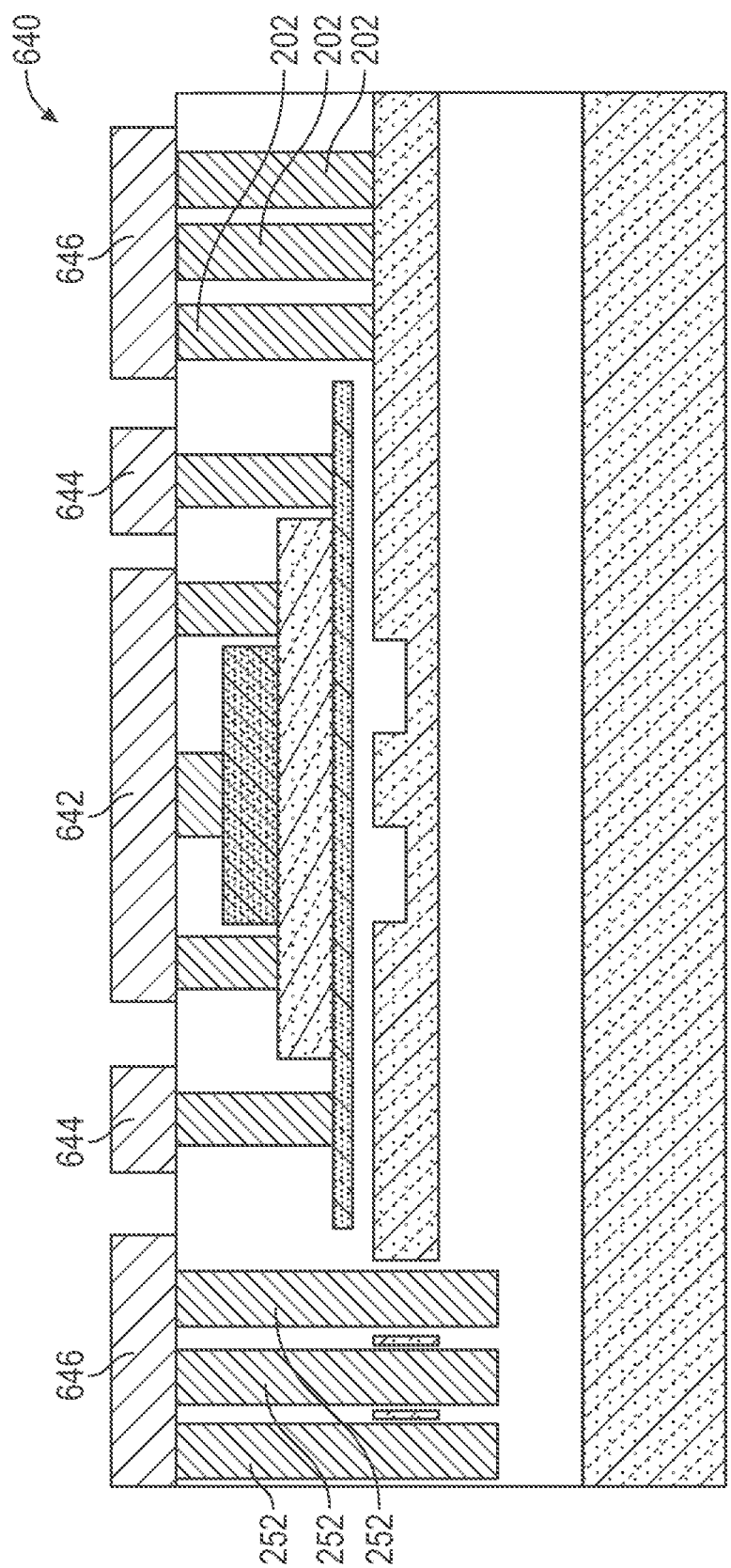
Figure 6F:
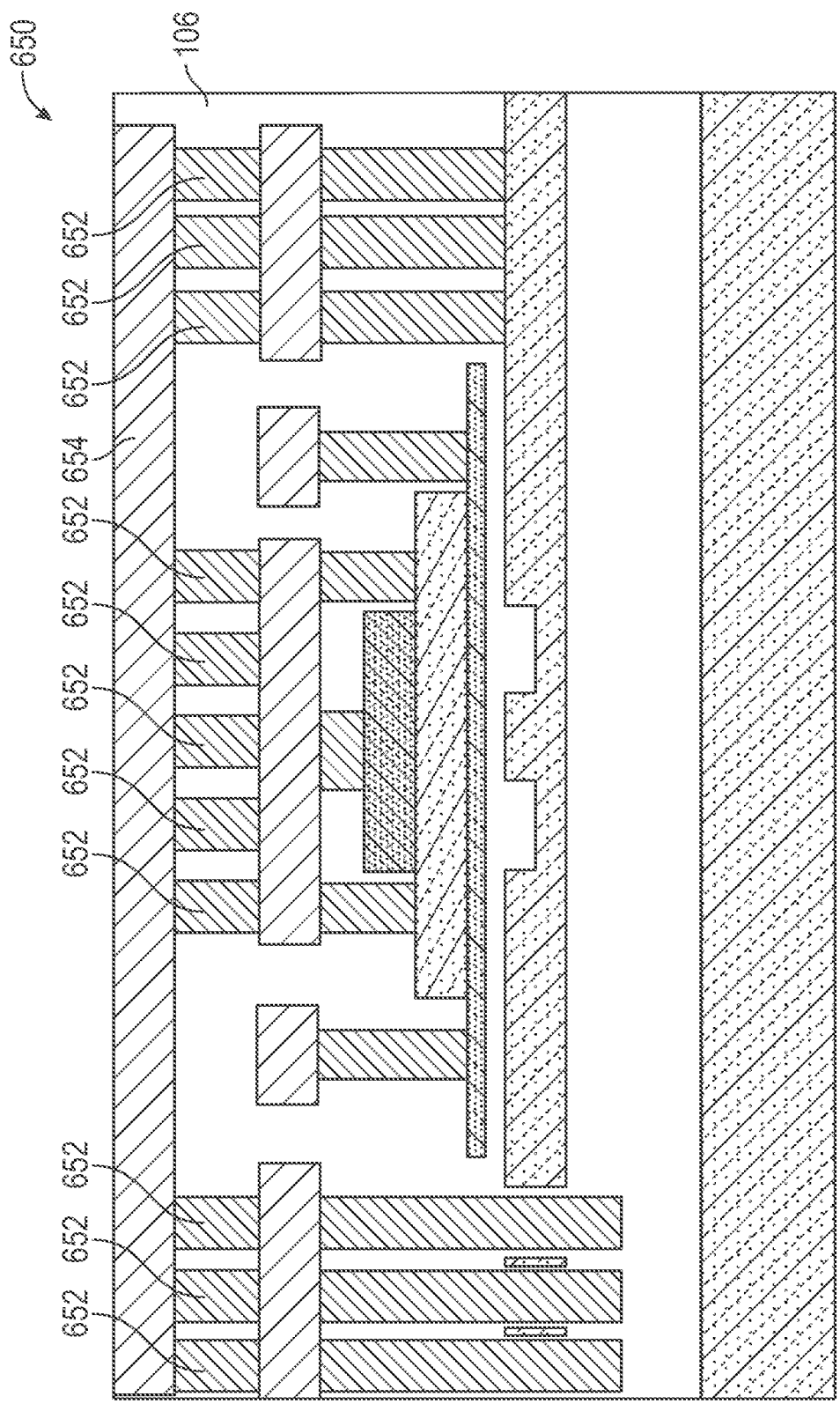

Once all via holes have been created, they may be filled, in act 514, with suitable electrically and thermally conductive material, e.g., one or more metals, to form the various electrical and thermal vias 140, 142, 202, 252, and/or 302; FIG. 6D shows the resulting structure 630. In some embodiments, the vias are filled with multiple layers of different metals. As will be appreciated by those of ordinary skill in the art, etching and filling via holes may alternate if different fill materials are used for different respective vias. For example, a first set of via holes may be etched and filled with a first metal (or multiple first metals), the metal deposited over the surface of the structure may be polished back to reveal the top oxide, and then a second set of via holes may be etched and filled with a second metal (or multiple second metals).

Following the creation of the various electrical and thermal vias, the associated p-side and n-side metal structures are formed in acts 516-520. As shown by way of example, a lower "level-1" metal layer may be deposited on top of the planar top oxide and patterned (in act 516) to form, as shown in the structure 640 of FIG. 6E, a portion 642 of the p-side metal as well as (at least part of) the n-side metal 644. Further, a level-1 thermal metal layer 646 connecting multiple thermal vias 202 or 252 may be formed to assist in lateral heat spreading. Note that the n-side metal 644 is electrically insulated from both the p-side metal 642 and the thermal metal layer 646. Next, as illustrated with the structure 650 of FIG. 6F, a further layer of top oxide 106 is deposited over the level-1 metal layer, and is thereafter patterned and etched to form vias 652 that establish connections between portions of the p-side metal residing in the level-1 and level-2 metal layers and between the p-side metal and the thermal vias (act 518). The level-2 metal layer 654 is then deposited (and, if needed, patterned) (act 520), resulting in the final structure 650 shown in FIG. 6F.

Having described different aspects and features of efficient heat-sinking in p-i-n diodes, the following numbered examples are provided as illustrative embodiments:

1. A device comprising: a semiconductor-on-insulator substrate comprising a semiconductor handle, a buried oxide layer disposed on top of the semiconductor handle, and a semiconductor device layer disposed on top of the buried oxide layer; a top oxide cladding disposed on the semiconductor device layer; a p-i-n diode embedded in the top cladding layer, the p-i-n diode comprising a doped top layer, an intrinsic layer, and a doped bottom layer; a metal structure embedded in the top oxide cladding and electrically connected to the doped top layer; and one or more thermal vias extending from the metal structure through the top oxide cladding at least to the semiconductor device layer, but not extending through the buried oxide layer to the semiconductor handle.

2. The device of example 1, wherein the one or more thermal vias contact the semiconductor device layer and wherein the doped bottom layer is electrically isolated from the semiconductor device layer.

3. The device of example 2, further comprising one or more isolation channels formed in the semiconductor device layer surrounding the p-i-n diode and the one or more thermal vias.

4. The device of example 1, wherein the one or more thermal vias extend through openings in the semiconductor device layer partially into the buried oxide layer and are electrically isolated from the semiconductor device layer.

5. The device of any one of examples 1-4, wherein a total cross-sectional area of the one or more thermal vias parallel to a plane of the semiconductor-on-insulator substrate exceeds an area of the intrinsic layer of the p-i-n diode.

6. The device of any one of examples 1-5, wherein the one or more thermal vias are first thermal vias, the device further comprising: one or more second thermal vias extending from a top surface of the intrinsic layer to the metal structure.

7. The device of example 6, wherein the doped top layer forms a ridge on top of the intrinsic layer, the one or more second vias being laterally offset from the ridge.

8. The device of any one of examples 1-7, wherein the doped top layer is a p-type layer and the doped bottom layer is an n-type layer.

9. The device of any one of examples 1-8, wherein the thermal vias comprise one or more metals.

10. A device comprising: a semiconductor-on-insulator substrate comprising a semiconductor handle, a buried oxide layer disposed on top of the semiconductor handle, and a semiconductor device layer disposed on top of the buried oxide layer; a top oxide cladding disposed on the semiconductor device layer; a p-i-n diode embedded in the top cladding layer, the p-i-n diode comprising a doped top layer, an intrinsic layer, and a doped bottom layer; a metal structure embedded in the top oxide cladding and electrically connected to the doped top layer; and one or more thermal vias extending from a top surface of the intrinsic layer to the metal structure.

11. The device of example 10, wherein the doped top layer forms a ridge on top of the intrinsic layer, the one or more thermal vias being laterally offset from the ridge.

12. The device of example 10 or example 11, wherein the doped top layer is a p-type layer and the doped bottom layer is an n-type layer.

13. The device of any one of examples 10-12, wherein the thermal vias comprise one or more metals.

14. The device of any one of examples 10-13, wherein the p-i-n diode comprises a compound semiconductor material.

15. A method comprising: forming a p-i-n diode embedded within a top oxide cladding on a semiconductor-on-insulator substrate, the p-i-n diode comprising doped top and bottom layers and an intrinsic layer therebetween; etching one or more first electrical via holes extending down to a top surface of the doped bottom layer; etching one or more thermal via holes, the one or more thermal via holes comprising at least one of one or more first thermal via holes extending down to at least a semiconductor device layer of the semiconductor-on-insulator substrate or one or more second thermal via holes extending down to a top surface of the intrinsic layer; etching a second electrical via hole extending down to a top surface of the doped top layer; and filling the first and second electrical via holes with one or more electrically conductive materials to form respective first and second electrical vias and filling the one or more thermal via holes with one or more thermally conductive materials to form one or more thermal vias.

16. The method of example 15, further comprising: forming metal structures connecting the one or more thermal vias and the second electrical via to a first common electrical node and connecting the one or more first electrical vias to a second electrical node.

17. The method of example 15 or example 16, wherein the first electrical via holes and the one or more thermal via holes are etched simultaneously.

18. The method of any one of examples 15-17, wherein the first and second electrical via holes and the one or more thermal via holes are filled with a same metal.

19. The method of any one of examples 15-18, further comprising, prior to forming the p-i-n diode, etching one or more openings through the semiconductor device layer of the semiconductor-on-insulator substrate, wherein the one or more thermal via holes comprise one or more first thermal via holes extending through the openings partially into a buried oxide layer underneath.

20. The method of any one of examples 15-19, wherein the one or more thermal via holes comprise one or more first thermal via holes ending at the semiconductor device layer, and wherein the p-i-n diode is formed on top of an insulating layer disposed on the semiconductor-on-insulator substrate.

Although the inventive subject matter has been described with reference to specific example embodiments, it will be evident that various modifications and changes may be made to these embodiments without departing from the broader spirit and scope of the inventive subject matter. Accordingly, the specification and drawings are to be regarded in an illustrative rather than a restrictive sense.

What is claimed is:

1. A device comprising:
   a silicon-on-insulator substrate comprising a silicon handle, a buried silicon dioxide layer disposed on top of the silicon handle, and a silicon device layer disposed on top of the buried silicon dioxide layer;
   a top silicon dioxide cladding disposed on the silicon device layer;
   a p-i-n diode embedded in the top silicon dioxide cladding layer, the p-i-n diode being made of III-V compound semiconductor material and comprising a doped top layer, an intrinsic layer, and a doped bottom layer;
   a metal structure embedded in the top silicon dioxide cladding and electrically connected to the doped top layer; and
   one or more thermal metal vias extending from the metal structure through the top silicon dioxide cladding at least to the silicon device layer, but not extending through the buried silicon dioxide layer to the silicon handle.

2. The device of claim 1, wherein the one or more thermal vias contact the silicon device layer and wherein the doped bottom layer is electrically isolated from the silicon device layer by a thin silicon dioxide layer forming an integral part of the top silicon dioxide cladding.

3. The device of claim 2, further comprising one or more isolation channels formed in the semiconductor device layer surrounding the p-i-n diode and the one or more thermal vias.

4. The device of claim 1, wherein the one or more thermal metal vias extend through openings in the silicon device layer partially into the buried oxide layer and are electrically isolated from the silicon device layer.

5. The device of claim 1, wherein a total cross-sectional area of the one or more thermal metal vias parallel to a plane of the silicon-on-insulator substrate exceeds an area of the intrinsic layer of the p-i-n diode.

6. The device of claim 1, wherein the one or more thermal metal vias are first thermal vias, the device further comprising:
   one or more second thermal metal vias extending from a top surface of the intrinsic layer to the metal structure.

7. The device of claim 6, wherein the doped top layer forms a ridge on top of the intrinsic layer, the one or more second vias being laterally offset from the ridge.

8. The device of claim 1, wherein the doped top layer is a p-type layer and the doped bottom layer is an n-type layer.

9. The device of claim 1, wherein the thermal vias comprise at least one of gold or aluminum.

10. A device comprising:
    a silicon-on-insulator substrate comprising a silicon handle, a buried silicon dioxide layer disposed on top of the silicon handle, and a silicon device layer disposed on top of the buried silicon dioxide layer;
    a top silicon dioxide cladding disposed on the silicon device layer;
    a p-i-n diode embedded in the top silicon dioxide cladding layer, the p-i-n diode being made of semiconductor compound material and comprising a doped top layer, an intrinsic layer, and a doped bottom layer;

a metal structure embedded in the top silicon dioxide cladding and electrically connected to the doped top layer; and one or more thermal metal vias extending from a top surface of the intrinsic layer to the metal structure.

11. The device of claim 10, wherein the doped top layer forms a ridge on top of the intrinsic layer, the one or more thermal metal vias being laterally offset from the ridge.

12. The device of claim 10, wherein the doped top layer is a p-type layer and the doped bottom layer is an n-type layer.

13. The device of claim 10, wherein the thermal metal vias comprise at least one of gold or aluminum.

14. The device of claim 10, wherein the p-i-n diode comprises a III-V compound semiconductor material.

15. A method comprising:

forming a p-i-n diode embedded within a top oxide cladding on a silicon-on-insulator substrate, the p-i-n diode comprising doped top and bottom layers and an intrinsic layer therebetween;

embedding, in the top oxide cladding, metal layers for connection to first and second electrical nodes;

forming, in the top oxide cladding, electrical vias connecting the doped top and bottom layers to the metal layers; and forming, in the top oxide cladding, one or more thermal vias for shunting heat across at least a portion of the top oxide cladding between the metal layers and at least one of the doped bottom layer and a silicon device layer of the substrate.

16. The method of claim 15, wherein forming the electrical vias and the one or more thermal vias comprises:

etching electrical via holes and one or more thermal via holes; and filling the electrical via holes and the one or more thermal via holes with one or more thermally conductive materials.

17. The method of claim 16, wherein at least one of the electrical via holes and at least one of the one or more thermal via holes are etched simultaneously.

18. The method of claim 16, wherein the electrical via holes and the one or more thermal via holes are filled with a same metal.

19. The method of claim 15, further comprising, prior to forming the p-i-n diode, etching one or more openings through the silicon device layer of the silicon-on-insulator substrate, wherein the one or more thermal vias comprise one or more first thermal vias extending through the openings partially into a buried oxide layer underneath.

20. The method of claim 15, wherein the one or more thermal vias comprise one or more first thermal vias ending at the silicon device layer, and wherein the p-i-n diode is formed on top of an insulating layer disposed on the silicon-on-insulator substrate.

* * * * *